(12) United States Patent
Clark et al.

(10) Patent No.: US 7,977,582 B2
(45) Date of Patent: Jul. 12, 2011

(54) FLEXIBLE MULTILAYER PRINTED CIRCUIT ASSEMBLY WITH REDUCED EMI EMISSIONS

(75) Inventors: Mark G. Clark, Rochester, MN (US); John R. Dangler, Rochester, MN (US); Matthew S. Doyle, Rochester, MN (US); Thomas D. Kidd, Stewartville, MN (US); Timothy L. McMillan, Rochester, MN (US); Jason T. Stoll, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 799 days.

(21) Appl. No.: 12/020,643

(22) Filed: Jan. 28, 2008

(65) Prior Publication Data

US 2009/0188712 A1 Jul. 30, 2009

(51) Int. Cl.
*H05K 1/11* (2006.01)

(52) U.S. Cl. ........... 174/262; 174/260; 29/852; 361/816

(58) Field of Classification Search .................. 174/254, 174/255, 260, 261, 262; 29/852; 361/816
See application file for complete search history.

(56) References Cited

U.S. PATENT DOCUMENTS

| 5,586,011 A * | 12/1996 | Alexander | 361/818 |
| 5,639,989 A * | 6/1997 | Higgins, III | 174/386 |
| 6,191,475 B1 * | 2/2001 | Skinner et al. | 257/700 |
| 2007/0000685 A1 * | 1/2007 | Inoue | 174/255 |

* cited by examiner

*Primary Examiner* — Ishwarbhai B Patel
(74) *Attorney, Agent, or Firm* — Rabin & Berdo, PC

(57) ABSTRACT

A flexible multilayer printed circuit assembly with shield fences. The flexible multilayer printed circuit assembly with multiple conductive layers includes logic ground vias that connect logic ground plane layers together, and shield vias that connect a top and a bottom shield plane layer together. Each of the shield fences is formed between the shield vias on an outside perimeter of each of the conductive layers. Each of the shield fences contains the logic ground vias inside, and also contains each corresponding conductive layer in the horizontal direction to which each layer extends.

22 Claims, 6 Drawing Sheets

FLEXIBLE MULTILAYER PRINTED CIRCUIT ASSEMBLY WITH REDUCED EMI EMISSIONS

BACKGROUND OF THE INVENTION

1. Field of the Invention

The invention relates to a flexible multilayer printed circuit assembly, and in particular, to a flexible multilayer printed circuit assembly that reduces EMI emissions by incorporating a shielding fence, a small via pad, or both.

2. Background Information

As processing speeds and packaging densities have increased, traditional wire cables cannot meet the requirements of high-speed signal interconnections. Flexible multilayer printed circuit assemblies have been developed for the high-speed interconnections between multiple computer processing units. These flexible multilayer printed circuit assemblies are high circuit density systems that can save space, can handle multiple conductive layers with its high circuit density, and can provide high-speed interconnections between multiple units. Because its flexibility greater than rigid printed circuit assembly, the flexible printed circuit assembly may be used where the assembly should be bent to interconnect computer units together. These benefits have increased use of the flexible multilayer printed circuit assemblies in place of the traditional wire cables for computer processor interconnections.

A typical flexible multilayer printed circuit assembly has multiple conductive layers that are made of conductive material. Each conductive layer is separated by a dielectric material. Generally, the conductive layers include logic ground plane layers used to provide a reference voltage plane or a logic ground plane. The conductive layers also include one or more signal wiring layers used to provide high-speed interconnect signal wirings. The signal wiring layer is sandwiched between the logic ground plane layers.

Information Technology Equipment (ITE) such as computers should meet Electromagnetic Interference (EMI) requirements for many countries. EMI emissions from the ITE equipment should be below CISPR 22 and FCC limits while the ITE equipment is operating in a typical manner. Accordingly, the conductive layers further include shield plane layers to shield the EMI emissions. In order to contain the EMI emissions coming from the high-speed interconnect signal wirings and electrical noise on the logic ground plane layers, the shield plane layers are formed as a top layer and a bottom layer of the flexible multilayer printed circuit assembly.

The typical flexible multilayer printed circuit assembly further includes vias to provide layer-to-layer interconnections. For example, the logic ground planes should be connected together using ground vias to keep them at the same potential. The top and bottom shield plane layers are connected to each other using shield vias along the perimeter of the structure to provide an electrical and mechanical connection between them.

Referring to FIG. 1, a conventional flexible multilayer printed circuit assembly 10 is provided. The printed circuit assembly 10 includes a top shield plane layer 11, a first logic ground plane layer 12, a first signal wiring layer 13, a second logic ground plane layer 14, a second signal wiring layer 15, a third logic ground plane layer 16, and a bottom shield plane layer 17. Each of the conductive layers 11 to 17 are separated from each other by layers made of a dielectric material. The printed circuit assembly 10 further includes logic ground vias 18 that electrically connect the logic ground plane layers 12, 14 and 16 together, and shield vias 19 that mechanically stitch and electrically connect the shield plane layers 11 and 17 together. The logic ground vias 18 may be formed as buried vias that extend between the ground plane layers. However, because such buried vias require higher manufacturing cost, the logic ground vias may be also formed as through-hole type vias, which penetrate the flexible multilayer assemblies from a top and a bottom thereof, as shown in FIG. 1. It is noted that the logic ground vias are separated from the shield plane layers 11 and 17, although they extends from a top surface and a bottom surface of the flexible multilayer printed circuit assembly 10, as shown FIGS. 1 and 2.

Unlike the traditional wire cables, flexible multilayer printed circuit assemblies cannot be easily shielded using metal foil and metal braids that may surround all of the top, bottom, and side surfaces of the assemblies. Because the signal wiring layers 13 and 15 and logic plane layers 12, 14 and 16 are electrically noisy, these layers 12, 13, 14, 15 and 16 should be contained inside a shield structure so as to contain the EMI emissions from those layers. As shown in FIG. 1, only top and bottom surfaces of the assembly 10 are shielded by the top and bottom shield plane layers 11 and 17. As a result, the EMI emissions in a direction toward the top and bottom shield plane layers 11 and 17 are shielded by the top and bottom shield plane layers 11 and 17. However, the EMI emissions of the flexible multilayer printed circuit assembly 10 in other directions, e.g., a horizontal direction to which the signal wiring layers 13 and 15 and the logic plane layers 12, 14 and 16 extend, are not sufficiently shielded. Thus, the flexible multilayer printed circuit assembly 10 will yield EMI emissions from the logic ground vias 18 protruding through the assembly surfaces and in proximity to the assembly surfaces, such as the edges of the assembly 10. These individual emissions can add together and potentially cause the ITE equipment to fail the EMI requirements.

Referring to FIG. 2, the shield vias 19 include top via pads 192 formed in the first shield plane layer 11 and bottom via pads (not shown) formed in the second shield plane layer 17. The logic ground vias 18 also include top via pads 182 and bottom via pads (not shown) respectively formed in the first and second shield plane layers 11 and 17. Conventionally, the top and bottom via pads of the logic ground vias 18 are as big as the top and bottom via pads of the shield vias 19, e.g., in diameter. Because a bigger logic ground via pad yields higher EMI emissions, the conventional printed circuit assembly with a big-sized logic ground via pads does not sufficiently reduce the EMI emissions.

SUMMARY OF THE INVENTION

According to one aspect of the invention, a flexible multilayer printed circuit assembly that incorporates shield fences is provided. The printed circuit assembly includes multiple conductive layers that are made of conductive material. The multiple conductive layers include a top shield plane layer and a bottom shield plane layer, a plurality of logic ground layers, at least one signal wiring layer. The shield fences is provided on all layers along the edges of structure. The printed circuit assembly also includes a plurality of logic ground vias that connect the logic ground plane layers together, and a plurality of shield vias that connect the top and bottom shield plane layers together. The logic ground vias and the shield vias are alternately provided along the perimeter of the flexible printed circuit assembly.

In another exemplary aspect of the invention, the shield fences are provided between the shield vias on an outside perimeter of each conductive layer. The shield fences may be made of copper or other metal or material that provides a shielding effect. Each of the fences contains the logic ground vias inside, and also contains each corresponding conductive layer in the horizontal direction to which each layer extends. The number of shield fences is variable corresponding to the number of the conductive layers with a different number of logic ground plane layers or a different number of signal wiring layers. The shield fences may be connected to all adjacent shield vias, or may be connected to two shield vias with at least one further shield via being disposed between the two connected shield vias. The height of each shield fence may be the same as or larger than the thickness of each corresponding conductive layer.

In a further exemplary aspect of the invention, a flexible multilayer printed circuit assembly that incorporates a small logic ground via pad is provided. The printed circuit assembly includes a logic ground via with a top via pad and a bottom via pad, and a shield via with a top via pad and a bottom via pad. The top and bottom via pads of the logic via are substantially smaller than the top and bottom via pads of the shield via.

In a further exemplary aspect of the invention, a flexible multilayer printed circuit assembly that incorporates logic vias connected to logic ground layers, and shield fences respectively corresponding each of layers including the logic ground layers and any layers between the logic ground layers.

In a further exemplary aspect of the invention, a flexible multilayer printed circuit assembly that incorporates logic vias connected to logic ground layers and extended to one of a top surface and a bottom surface of the printed circuit assembly, and shield fences respectively corresponding each of layers including the connected logic ground layers, one of a top and a bottom shield plane layer, and any layers therebetween.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper", "lower", "front", "back", "over", "under", and similar such terms are not to be construed as limiting the invention to a particular orientation. Instead, these terms are used only on a relative basis.

Figure 1:
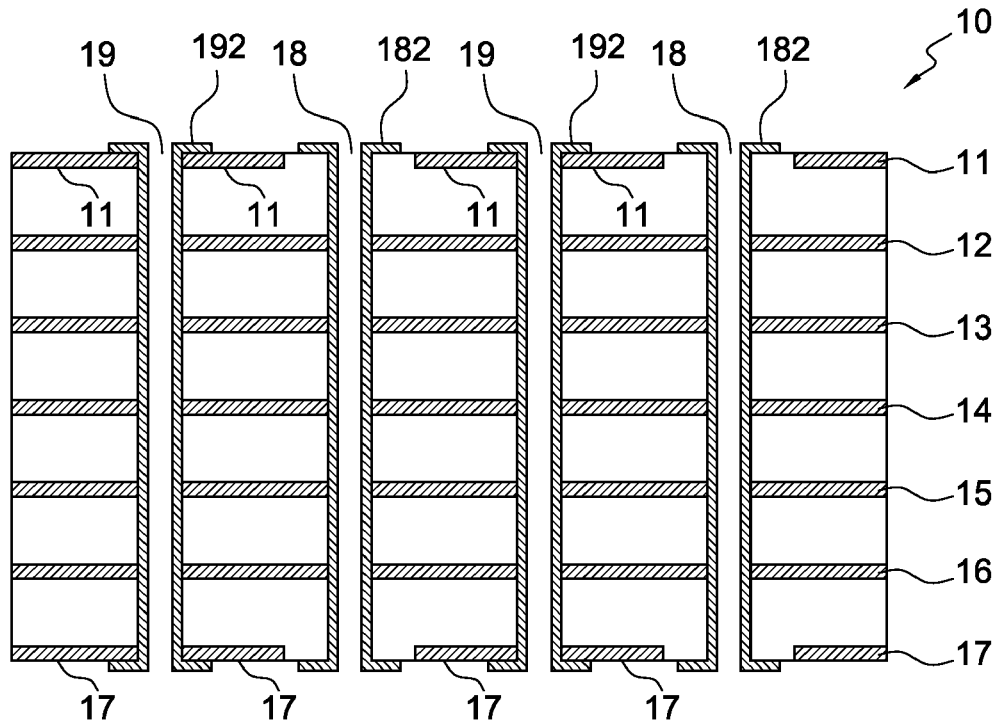
FIG. 1 is a schematic cross-sectional view of a conventional flexible multilayer printed circuit assembly.
Figure 3:
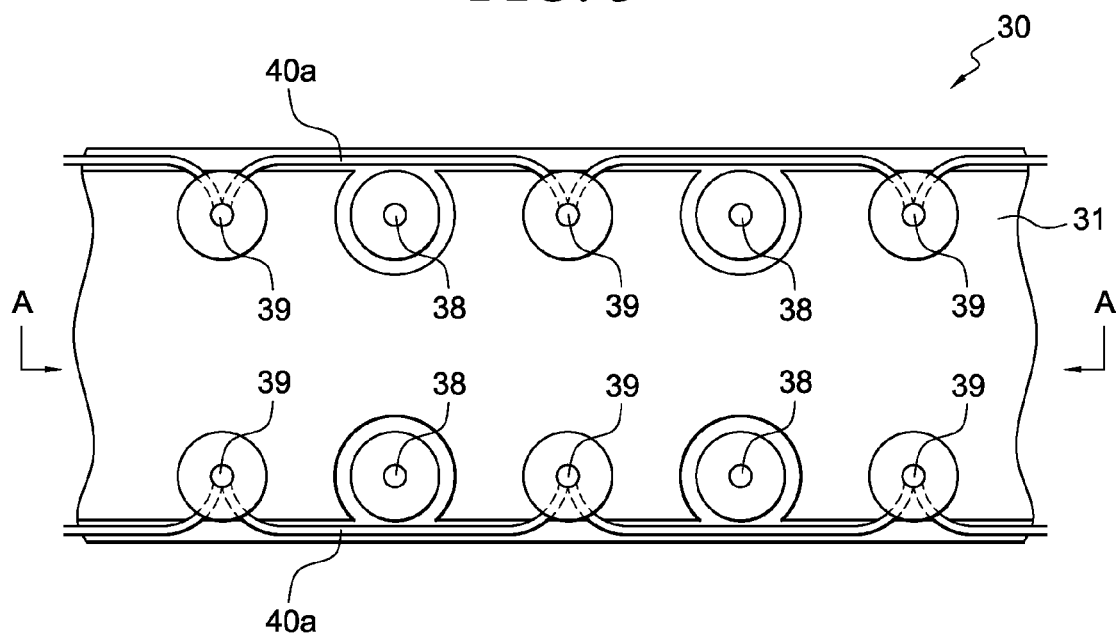
FIG. 3 is a top plan view of a flexible multilayer printed circuit assembly incorporating shield fences, according to an exemplary embodiment of the present invention.
Figure 4:
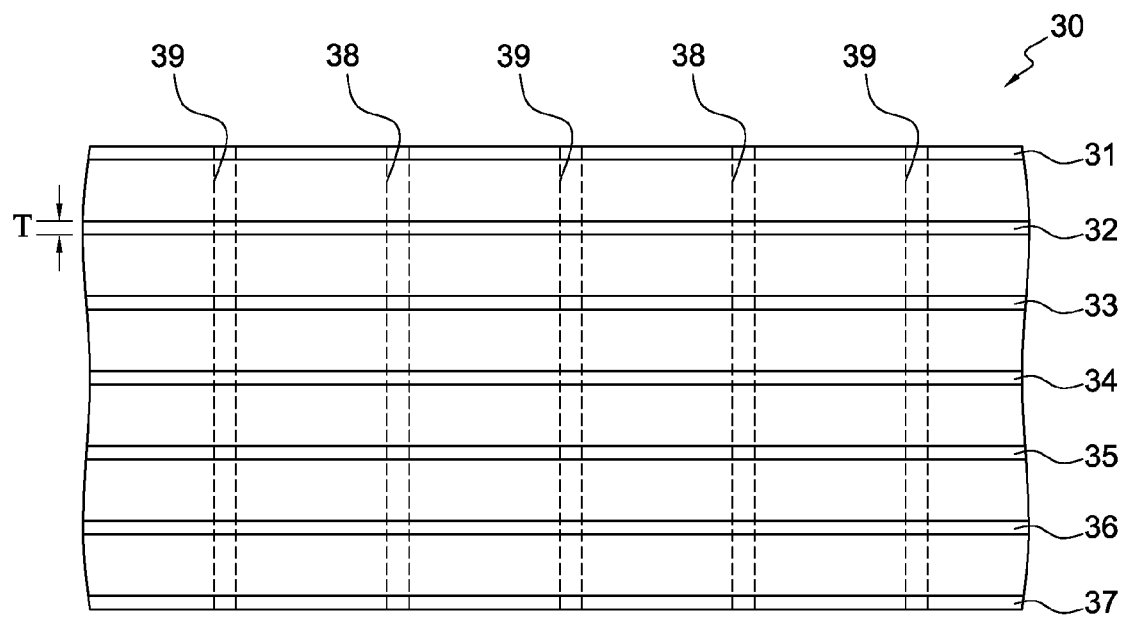
FIG. 4 is a schematic cross-sectional view of the flexible multilayer printed circuit assembly taken along the line A-A in FIG. 3.

FIG. 3 is a partial top plan view of a flexible multilayer printed circuit assembly 30, according to an exemplary embodiment of the invention. The printed circuit assembly 30 includes multiple conductive layers that are made of conductive material. The multiple conductive layers may have similar layer structure of the assembly 10, as shown in FIG. 1. Referring to FIG. 4, the printed circuit assembly 30 includes a top shield plane layer 31, a first logic ground plane layer 32, a first signal wiring layer 33, a second logic ground plane layer 34, a second signal wiring layer 35, a third logic ground plane layer 36, and a bottom shield plane layer 37. Each of the conductive layers 31 to 37 are separated from each other by intermediate layers made of a dielectric material. However, the printed circuit assembly 30 is not limited to these multilayers, but may have a different number of multilayers with a different number of logic ground plane layers or a different number of signal wiring layers.

The printed circuit assembly 30 also includes a plurality of logic ground vias 38 that connect the logic ground plane layers 32, 34 and 36 together, and a plurality of shield vias 39 that connect the top and bottom shield plane layers 31 and 37 together. The logic ground vias 38 may be further extended to and connected between a top surface and a bottom surface of the printed circuit assembly 30, as shown in FIGS. 3 and 4. Because these vias introduce discontinuities, it is desirable to minimize the use of the vias. Accordingly, as shown in FIG. 3, the logic ground vias 38 and the shield vias 39 may be provided along the perimeter of the flexible printed circuit assembly 30. Further, in order to minimize the overall width of the flexible multilayer printed circuit assembly, each logic ground via 38 and each shield via 39 can be provided alternately along the perimeter of the printed circuit assembly 30.

The printed circuit assembly 30 further includes shield fences between the shield vias 39 on an outside perimeter of each conductive layer 31 to 37. The shield fences are made of copper or other metal or material that provides a shielding effect. Referring to FIG. 3, a shield fence 40a is formed on an outside perimeter of the top shield plane layer 31 and between the shield vias 39. The shield fence 40a connects the adjacent shield vias 39 together so that the logic ground vias 38 are enclosed inside the shield fences 39.

Figure 5:
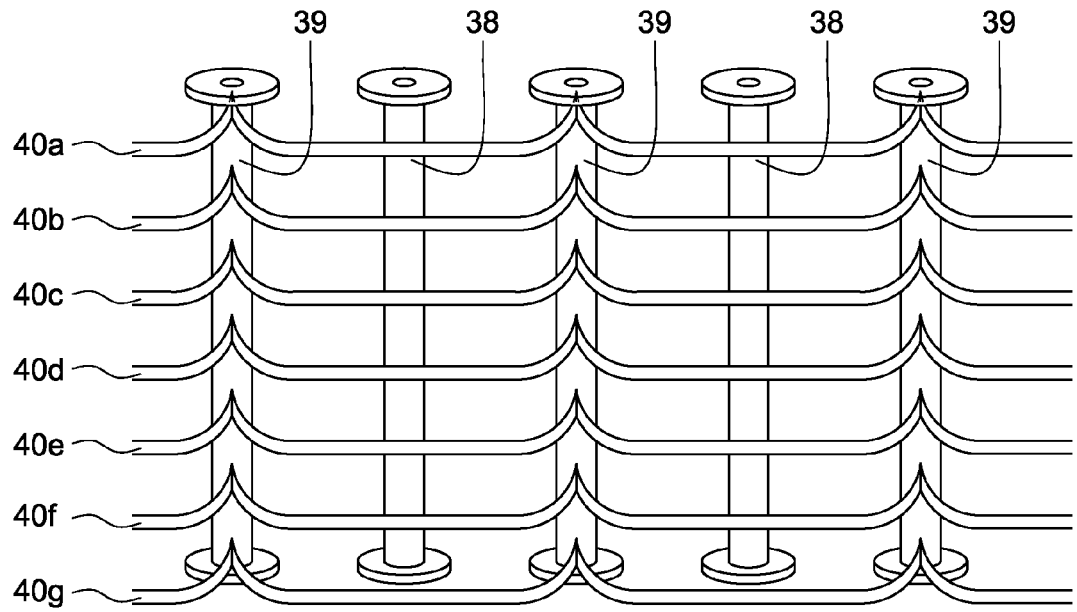
FIG. 5 is a schematic perspective view of the shield fences shown in FIG. 3, illustrating the connection of the shield fences with shield vias while logic ground vias are contained inside the shield fences.

More specifically, as shown in FIG. 5, seven shield fences 40a to 40g (hereafter collectively 40) are provided between the shield vias 39. Each of the fences 40a to 40g contains the logic ground vias 38 inside. Because the logic ground vias 38 are formed along the perimeter of the assembly 30, the shield fence 40a connected to the shield vias 39, as shown in FIG. 5, also contains the top shield plane layer 31 inside the fence 40a in a horizontal direction to which the top shield plane layer 31 extends, as shown in FIG. 3. Likewise, the other fences 40b to 40g connected to the shield vias 39 also contain each corresponding conductive layer 32 to 37 in the horizontal direction to which each layer 32 to 37 extends. The number of shield fences is variable corresponding to the number of the conductive layers with a different number of logic ground plane layers or a different number of signal wiring layers.

Figure 11:
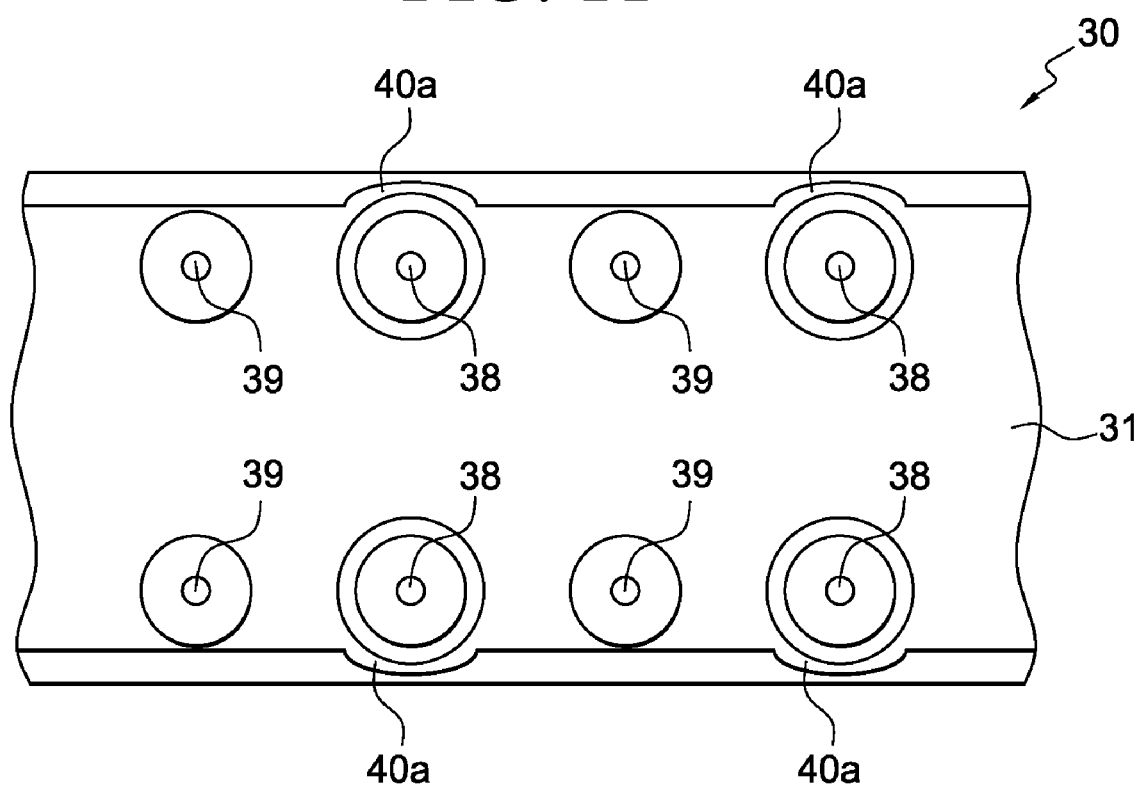
FIG. 11 is a top plan view of a flexible multilayer printed circuit assembly incorporating shield fences, according to an exemplary embodiment of the present invention. The printed circuit assembly of FIG. 11 is the same as that of FIG. 3, except that a top shield fence is connected to a top shield plane layer, rather than to the shield vias.

However, the shield fences on the top and bottom layers may not be connected to the shield vias. Instead, they can just go around the logic ground vias 38 and connect directly to the top and bottom shield plane layers 31 and 37. As shown in FIG. 11, the top shield fence 40a may connect only to the top shield plane layer 31. Likewise, the bottom shield fence 40g may connect only to the bottom shield plane layer 37, while all other shield fences 40b to 40f connect directly to the shield via 39.

The shield fences 40b, 40d and 40f surround the logic ground plane layers 32, 34 and 36 as well as the logic ground vias 38 connected to the layers 32, 34 and 36, effectively shielding the EMI emissions from the layers 32, 34 and 36 and the vias 38. The shield fences 40c and 40e surround each signal wiring layers 33 and 35, effectively shielding the EMI emissions from the layers 33 and 35 and vias 38. The shield fences 40a and 40g surround the logic ground vias 38, effectively shielding the EMI emissions that may be originally yielded by the layers 32 to 36 and be emitted through the vias 38 connected to any of the layers 32 to 36. The shield fences 40 collectively provide a shield termination for the logic ground planes, logic vias, and high speed signal wirings within the multilayer printed circuit assembly 30. Accordingly, the shield fences 40 provide a better shield from EMI emissions caused by the logic ground plane layers 32, 34 and 36, the signal wiring layers 33 and 35, and logic ground vias 38 connecting the ground plane layers 32, 34 and 36.

The shield fences 40 may be formed by connecting all adjacent shield vias that are apart from each other with a logic ground via being disposed between them. Referring to FIGS. 3 and 5, all adjacent two shield vias 39 are connected to each other by the shield fences 40. However, the shield fences 40 may be formed in various ways only if each conductive layer 31 to 37 and corresponding portions of the logic ground vias 38 are enclosed inside the fences 40. For example, the shield fences 40 can be connected to two shield vias, with at least one further shield via being disposed between the two connected shield vias.

Figure 6:
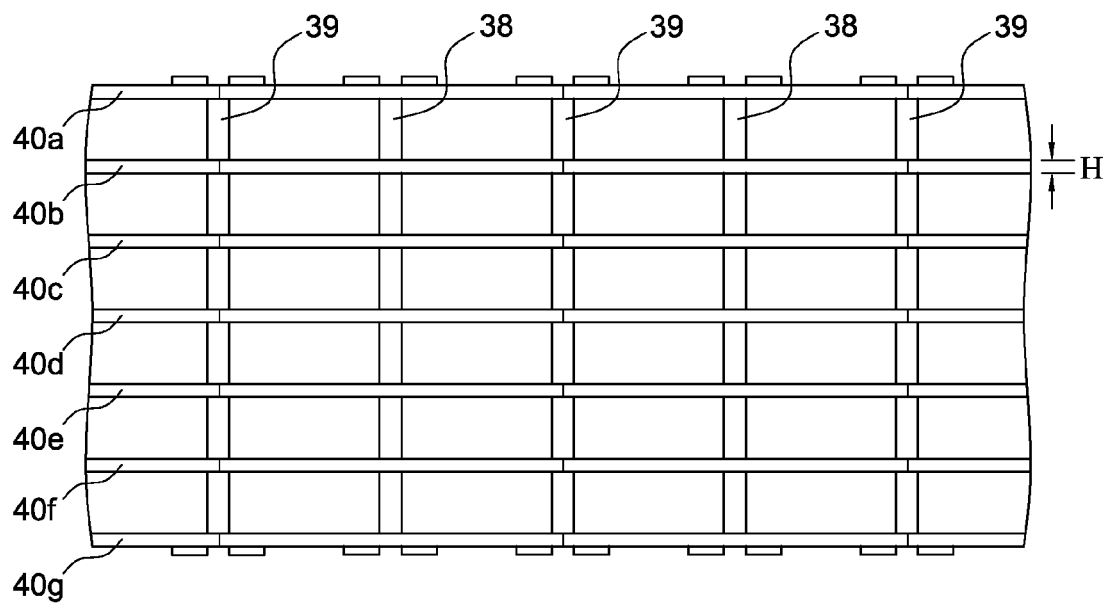
FIG. 6 is a schematic front view of the shield fences and vias shown in FIG. 5.

FIG. 6 is a front partial view of the shield fences 40 shown in FIG. 5. The height of each shield fence 40 may be the same as or larger than the thickness of each corresponding conductive layer 31 to 37. For example, the height H of the shield fence 40b shown in FIG. 6 is the same as or larger than the thickness T of the first logic ground plane layer 32 shown in FIG. 4, so that the fence 40b covers the layer 32 entirely in a horizontal direction to which the layer 32 extends.

Figure 2:
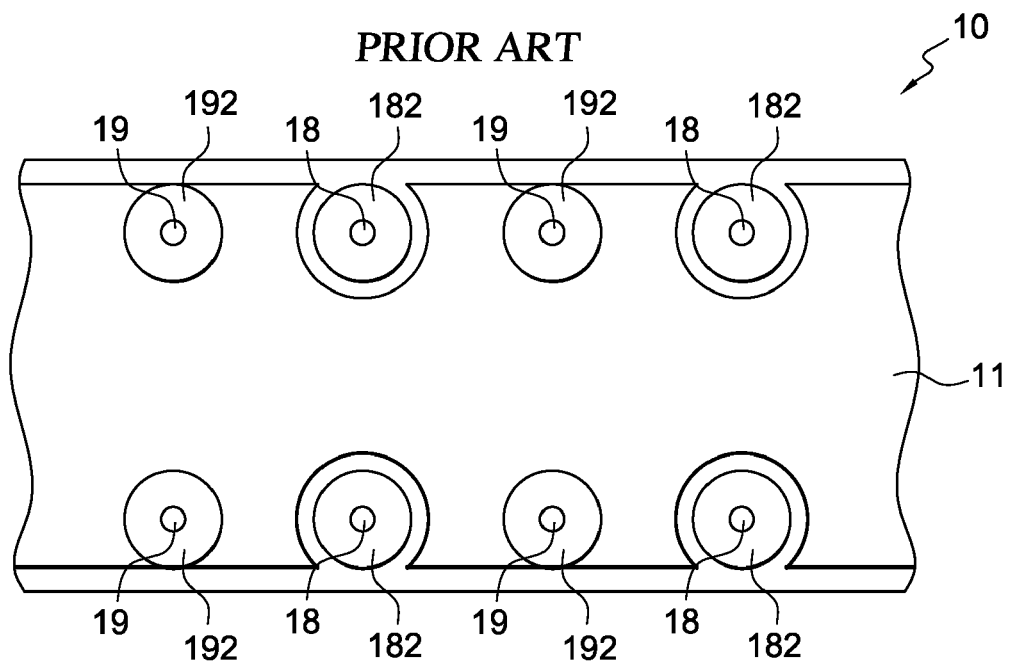
FIG. 2 is a top plan view of the conventional flexible multilayer printed circuit assembly shown in FIG. 1.
Figure 7:
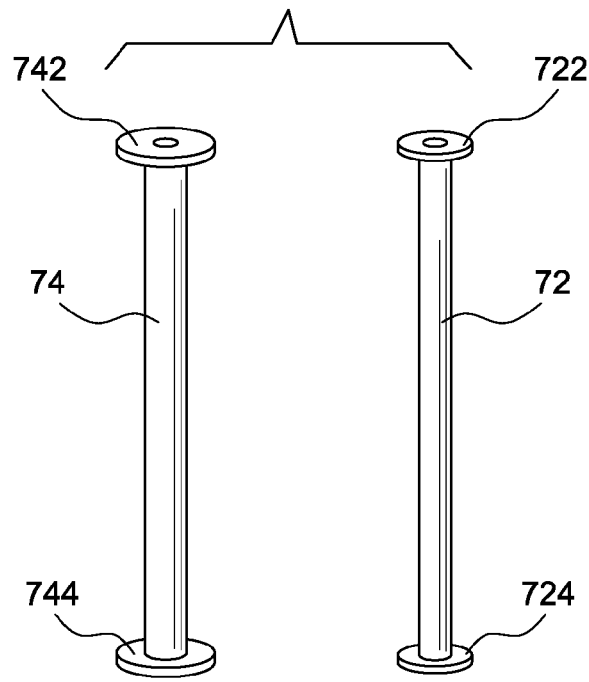
FIG. 7 is a schematic perspective view of a logic ground via with a shield via, according to another exemplary embodiment of the present invention, illustrating the via pads of the logic ground via is smaller than those of the shield via.

FIG. 7 is a perspective view of a logic ground via 72 and a shield via 74, according to another exemplary embodiment of the present invention. The logic ground via 72 includes a top via pad 722 and a bottom via pad 724. The top and bottom via pads 722 and 724 may be respectively disposed on a top surface and on a bottom surface of the printed circuit assembly 30, similar to the pads 182 shown in FIGS. 1 and 2. The shield via 74 includes a top via pad 742 on the top shield plane layer 31 and a bottom via pad 744 on the bottom shield plane layer 37. The logic via 72 inherently need via pads on layers where the logic via 72 connects to logic ground plane layers 32, 34 and 36, so as to provide electrical connections between the logic via 72 and the logic ground plane layers 32, 34 and 36. In contrast, the top and bottom via pads 722 and 724 of the logic via 72 are needed only for the supplementary purposes, e.g., for reducing the cost for forming the logic via 72, or for providing temporary electrical connections to the logic via 72 while forming the logic via 72. Accordingly, the top and bottom via pads 722 and 724 can be reduced to a minimum size required to create via barrel structure.

Figure 8:
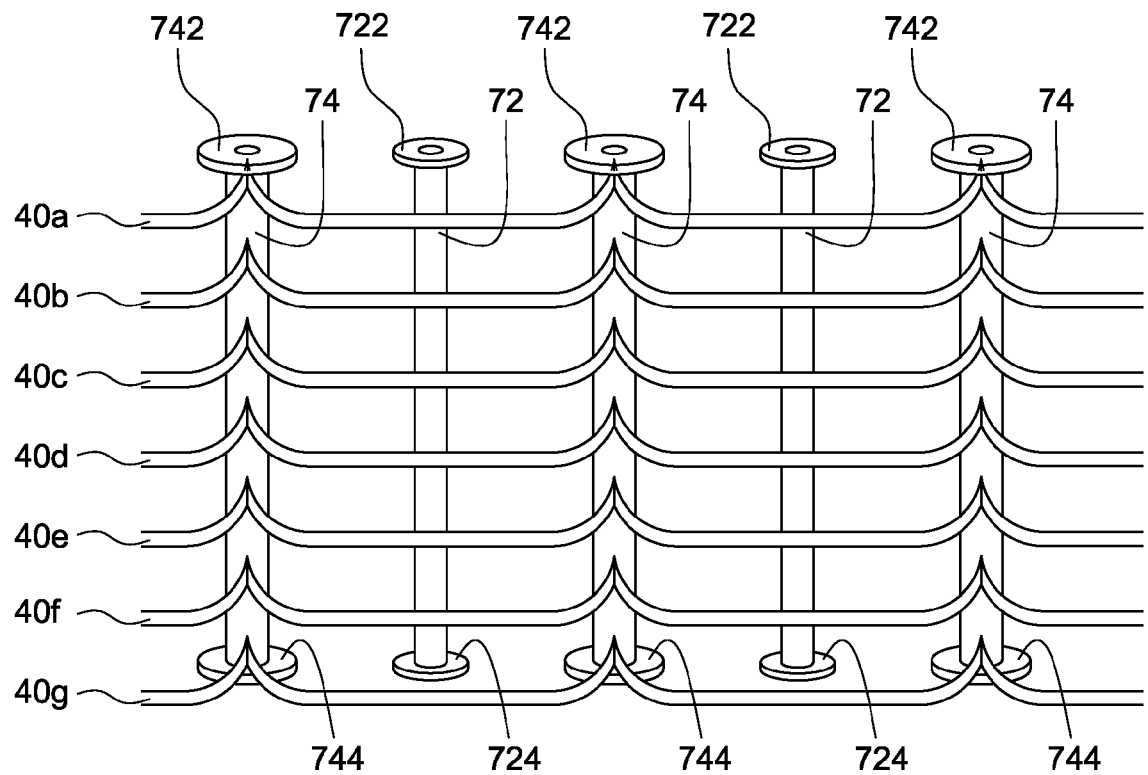
FIG. 8 is a schematic perspective view, illustrating connection of shield fences with the shield vias shown in FIG. 7, while the logic ground vias with the smaller via pads shown in FIG. 7 are contained inside the shield vias.

As shown in FIG. 7, the top and bottom via pads 722 and 724 of the logic via 72 are substantially smaller in diameter than the top and bottom via pad 742 and 744 of the shield via 74. By using the term "substantially," Applicants means more than dimensional tolerances, and means that the via pads 722 and 724 are tailored to have a different size in order to reduce the EMI emissions from the via pads 722 and 724. For example, the top and bottom via pads 722 and 724 of the logic via 72 may be 30% smaller in diameter than the top and bottom via pad 742 and 744 of the shield via 74. This reduces the physical size protruding through the top and bottom surface of the printed circuit assembly 30, and hence reduces emissions from the logic plane layers 32, 34 and 36 without adding cost to the assembly. FIG. 8 is a schematic perspective view of shield fences and vias incorporating the logic ground via 72 and the shield via 74 shown in FIG. 7.

Figure 9:
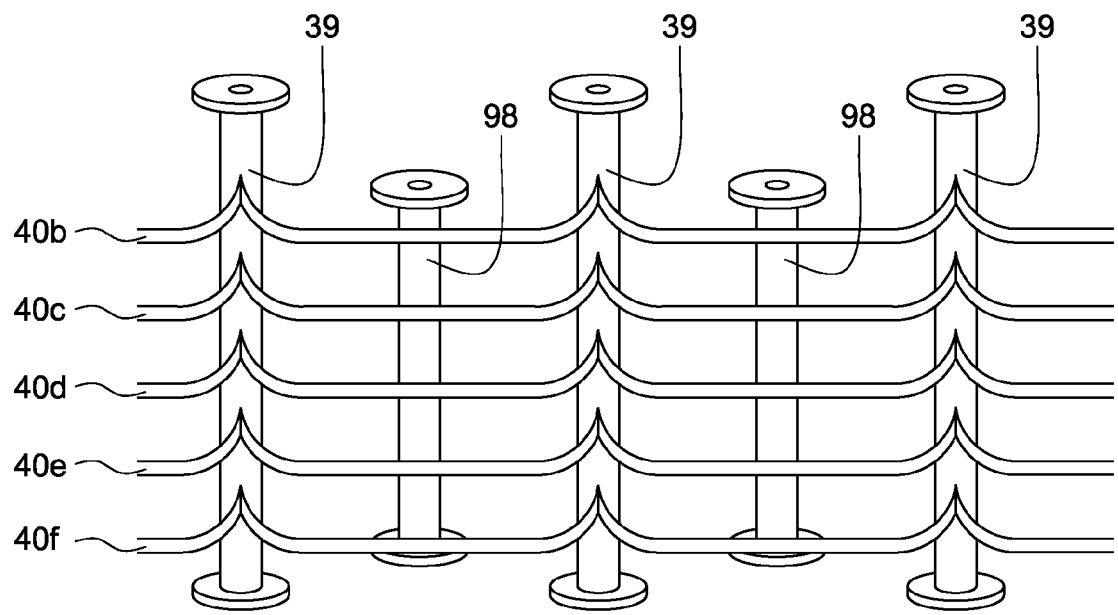
FIG. 9 is a schematic perspective view of shield fences connected with shield vias, while logic ground vias formed as buried vias are contained inside the shield fences, according to another exemplary embodiment of the present invention.

Further, since logic vias inherently need via pads on layers where the logic vias connects to logic planes, the logic vias can be connected to and extended between logic ground layers only. FIG. 9 is a schematic perspective view of shield fences connected with shield vias while logic ground vias are contained inside the shield fences. Logic ground vias 98 are identical to the logic ground vias 40 shown in FIG. 5, except that they extend only between the logic ground layers 32 and 36. Accordingly, there is no need of providing shield fences, such as the shield fences 40a and 40g, to the top and bottom shield layers. Rather, the shield fences 40b to 40f respectively corresponding each of the layers 32 to 36 are provided.

Figure 10:
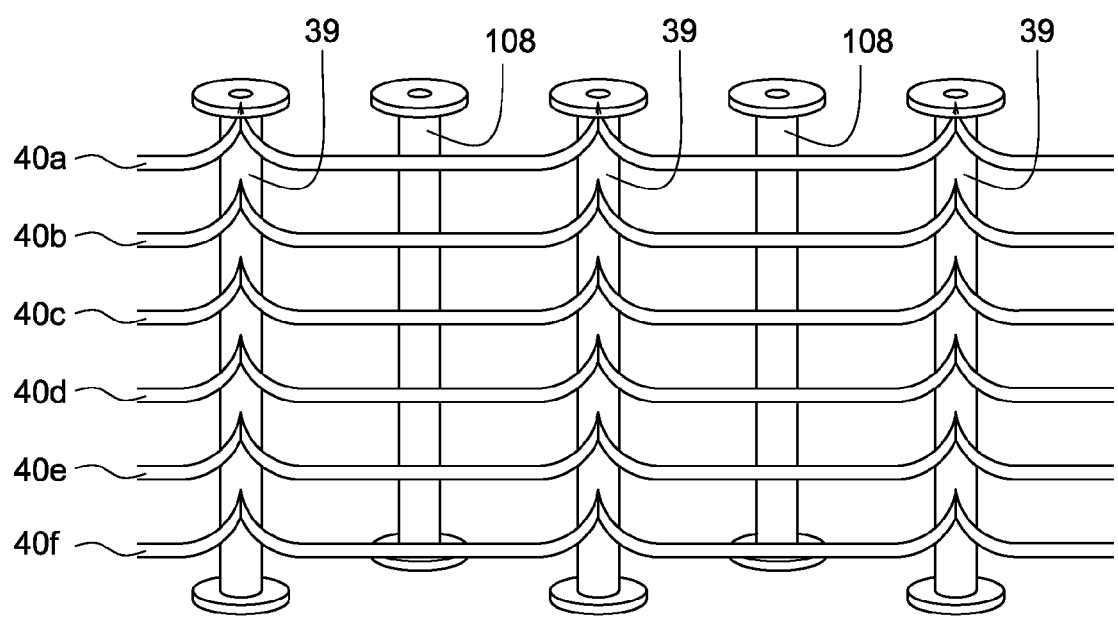
FIG. 10 is a schematic perspective view of shield fences connected with shield vias while logic ground vias are contained inside the shield fences, according to another exemplary embodiment of the present invention.

Further, the logic vias connected to logic ground layers can be further connected to only one of a top surface and a bottom surface of the printed circuit assembly. FIG. 10 is a schematic perspective view of shield fences connected with the shield vias 39 while logic ground vias 108 are contained inside the shield fences 40a to 40f. The logic ground vias 108 are identical to the logic ground vias 38 shown in FIGS. 4 and 5, except that they extend only from the top surface of the assembly to the third logic ground plane layer 36 of FIG. 4. There is no need of providing any shield fence, such as the shield fence 40g. Accordingly, the shield fences 40a to 40f respectively corresponding each of the layers 31 to 36 of FIG. 4 are provided.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings. It will be understood that the above description of the preferred embodiments of the present invention are susceptible to various modifications, changes, and adaptations, and the same are intended to be comprehended within the meaning and range of equivalents of the appended claims.

What is claimed is:

1. A multilayer printed circuit assembly, comprising:
   a top shield plane layer;
   a bottom shield plane layer;

a plurality of logic ground plane layers disposed between the top and bottom shield plane layers;

at least one signal wiring layer disposed between the logic ground plane layers;

shield vias connected between the top and bottom shield plane layers;

logic ground vias electrically connected to the logic ground plane layers, and connected between a top surface and a bottom surface of the multilayer printed circuit assembly; and a plurality of shield fences respectively formed on an outside perimeter of each of the top shield plane layer, bottom shield plane layer, signal wiring layer, and logic ground plane layers, the logic ground vias being contained inside the shield fences.

2. The multilayer printed circuit assembly of claim 1, wherein each shield fence is formed between and connected to adjacent shield vias.

3. The multilayer printed circuit assembly of claim 1, wherein:

the plurality of shield fences include a top shield fence on the outside perimeter of the top shield plane layer, and a bottom shield fence on the outside perimeter of the bottom shield layer; and the top and bottom shield fences are respectively connected to the top and bottom shield plane layers; and each shield fence other than the top and bottom shield fences is formed between and connected to adjacent shield vias.

4. The multilayer printed circuit assembly of claim 1, wherein each shield fence is formed between and connected to two shield vias, with at least one further shield via being disposed between the two connected shield vias.

5. The multilayer printed circuit assembly of claim 1, wherein:

the plurality of shield fences include a top shield fence on the outside perimeter of the top shield plane layer, and a bottom shield fence on the outside perimeter of the bottom shield layer;

the top and bottom shield fences are respectively connected to the top and bottom shield plane layers; and each shield fence other than the top and bottom shield fences is formed between and connected to two shield vias, with at least one further shield via being disposed between the two connected shield vias.

6. The multilayer printed circuit assembly of claim 1, wherein a height of each shield fence is the same as or greater than a thickness of each of the top shield plane layer, bottom shield plane layer, signal wiring layer, and logic ground plane layers.

7. The multilayer printed circuit assembly of claim 1, wherein the logic ground vias are formed along a perimeter of the multilayer printed circuit assembly.

8. The multilayer printed circuit assembly of claim 1, wherein the shield vias are formed along a perimeter of the multilayer printed circuit assembly.

9. The multilayer printed circuit assembly of claim 1, wherein the shield vias and the logic ground vias are formed along a perimeter of the multilayer printed circuit assembly, and each shield via and each logic ground via are alternately disposed.

10. The multilayer printed circuit assembly of claim 1, wherein the shield fences are made of metal or other shielding material.

11. The multilayer printed circuit assembly of claim 1, wherein the shield fences are made of copper.

12. The multilayer printed circuit assembly of claim 1, wherein:

each shield via includes a top via pad disposed on the top shield plane layer and a bottom via pad disposed on the bottom shield plane layer;

each logic ground via includes a top via pad and a bottom via pad; and the top and bottom via pads of each logic ground via are substantially smaller than the top and bottom via pads of each shield via.

13. A multilayer printed circuit assembly, comprising:

a top shield plane layer;

a bottom shield plane layer; a plurality of logic ground plane layers disposed between the top and bottom shield plane layers;

at least one signal wiring layer disposed between the logic ground plane layers;

shield visa connected between the top and bottom shield plane layers; and logic ground visa electrically connected to the logic ground plane layers, and connected between a top surface and a bottom surface of the multilayer printed circuit assembly, wherein:

each shield via includes a top via pad disposed on the top shield plane layer and a bottom via pad disposed on the bottom shield plane layer;

each logic ground via includes a top via pad disposed on a top surface of the multilayer printed circuit assembly and a bottom via pad disposed on a bottom surface of the multilayer printed circuit assembly; and the top and bottom via pads of each logic ground via are substantially smaller than the top and bottom via pads of each shield via; and a plurality of shield fences respectively formed on an outside perimeter of each of the to shield plane layer, bottom shield plane layer, signal wiring layer, and logic ground plane layers, the logic ground vias being contained inside the shield fences.

14. A multilayer printed circuit assembly, comprising:

a top shield plane layer and a bottom shield plane layer;

a plurality of shield vias stitching the top and bottom shield plane layers together;

a plurality of conductive layers between the top and bottom shield plane layers including an upper logic ground plane layer and a lower logic ground plane layer;

a plurality of ground vias connected to the upper and lower logic ground plane layers; and shield fences on an outside perimeter of the upper logic ground plane layer, lower logic ground plane layer, and layers between the upper and lower logic ground plane layers, wherein the logic ground vias, the upper and lower logic ground plane layers, and the layers between the upper and lower logic ground plane layers are contained inside the shield fences.

15. The multilayer printed circuit assembly of claim 14, wherein each shield fence is formed between and connected to adjacent shield vias.

16. The multilayer printed circuit assembly of claim 14, wherein each shield fence is formed between and connected to two shield vias, with at least one further shield via being disposed between the two connected shield vias.

17. The multilayer printed circuit assembly of claim 14, wherein a height of each shield fence is the same as or greater than a thickness of each of the upper and lower logic ground plane layers and the layers between the upper and lower logic ground plane layers.

18. The multilayer printed circuit assembly of claim 14, wherein the shield fences are made of metal or other shielding material.

19. The multilayer printed circuit assembly of claim 14, wherein:
the ground vias are further connected to a top surface of the multilayer printed circuit assembly; and
the multilayer printed circuit assembly includes additional shield fences on an outside perimeter of the top shield plane layer and layers between the top shield plane layer and the upper logic ground plane layer.

20. The multilayer printed circuit assembly of claim 19, wherein each of the additional shield fences is formed between and connected to adjacent shield vias.

21. The multilayer printed circuit assembly of claim 19, wherein each of the additional shield fences is formed between and connected to two shield vias, with at least one further shield via being disposed between the two connected shield vias.

22. A method of manufacturing a multilayer printed circuit assembly, comprising:
providing a top shield plane layer;
providing a bottom shield plane layer;
providing a plurality of logic ground plane layers disposed between the top and bottom layer;
providing at least one signal wiring layer disposed between the logic ground plane layers;
providing shield vias connected between the top and bottom shield plane layers;
providing logic ground vias electrically connected to the logic ground plane layers, and connected between a top surface and a bottom surface of the printed circuit assembly; and
providing a plurality of shield fences respectively formed on an outside perimeter of each of the top shield plane layer, bottom shield plane layer, signal wiring layer, and logic ground plane layers, the logic ground vias being contained inside the shield fences.

* * * * *